United States Patent [19]

Harada et al.

[11] Patent Number: 5,150,388
[45] Date of Patent: Sep. 22, 1992

[54] SOLID STATE IMAGE SENSING DEVICE OUTPUT

[75] Inventors: Nozomu Harada; Yukio Endo; Yuji Ide, all of Yokohama, Japan

[73] Assignee: Kabushiki Kaisha Toshiba, Kawasaki, Japan

[21] Appl. No.: 757,614

[22] Filed: Sep. 11, 1991

[30] Foreign Application Priority Data

Sep. 12, 1990 [JP] Japan .................................. 2-239885

[51] Int. Cl.$^5$ ...................... G11C 19/28; H01L 29/78
[52] U.S. Cl. .......................................... 377/60; 357/24
[58] Field of Search ................ 357/24, 30; 377/57-63

Primary Examiner—Gene M. Munson
Attorney, Agent, or Firm—Oblon, Spivak, McClelland, Maier & Neustadt

[57] ABSTRACT

A solid state image sensing device comprises an image sensor for outputting optical images as signal charges, a charge transfer section for transferring signal charges, a first reading section for non-destructively reading transferred signal charges as a plurality of first output signal components, a detecting section for detecting the difference between the first output signal components, a second reading section for adding the signal charges corresponding to the first output signal components which correspond to the difference signal and reading the added signal charges as a second output signal component, an adding section for inserting at least one signal component corresponding to the second output signal component to one or more first output signal components which are canceled due to charge-transfer for addition of signal charges and generating an output signal including a third output signal component, and a level lowering section for lowering the signal levels of the second and third output signal components according to the number of addition stages.

15 Claims, 9 Drawing Sheets

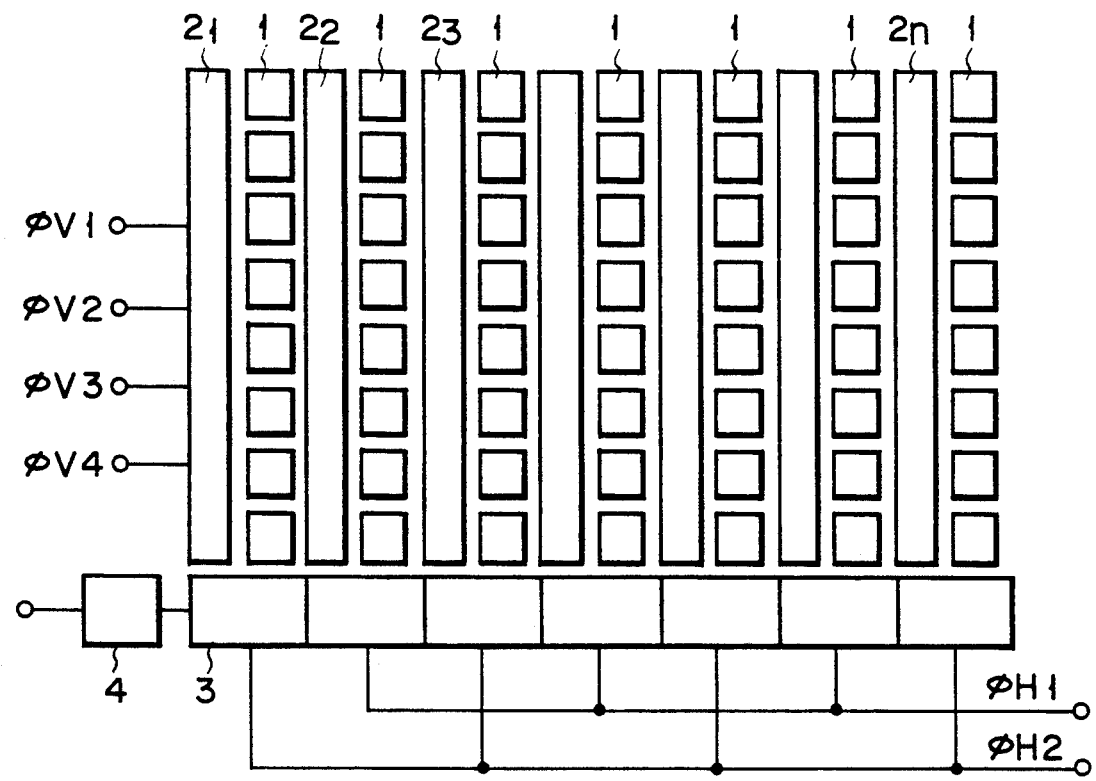
F I G. 1
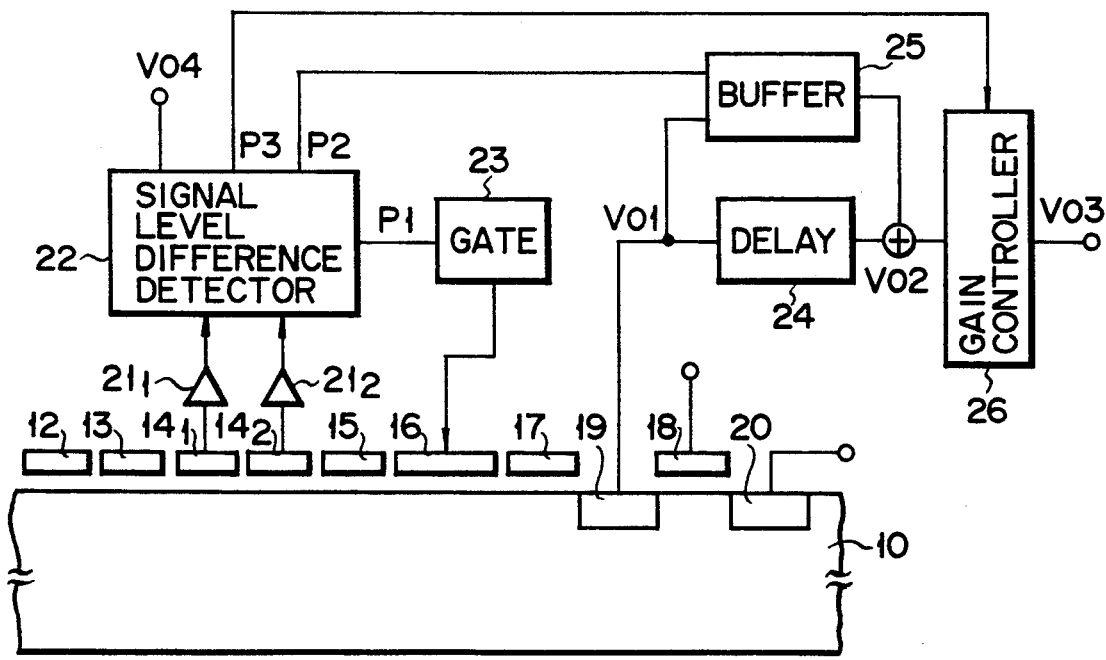
F I G. 2

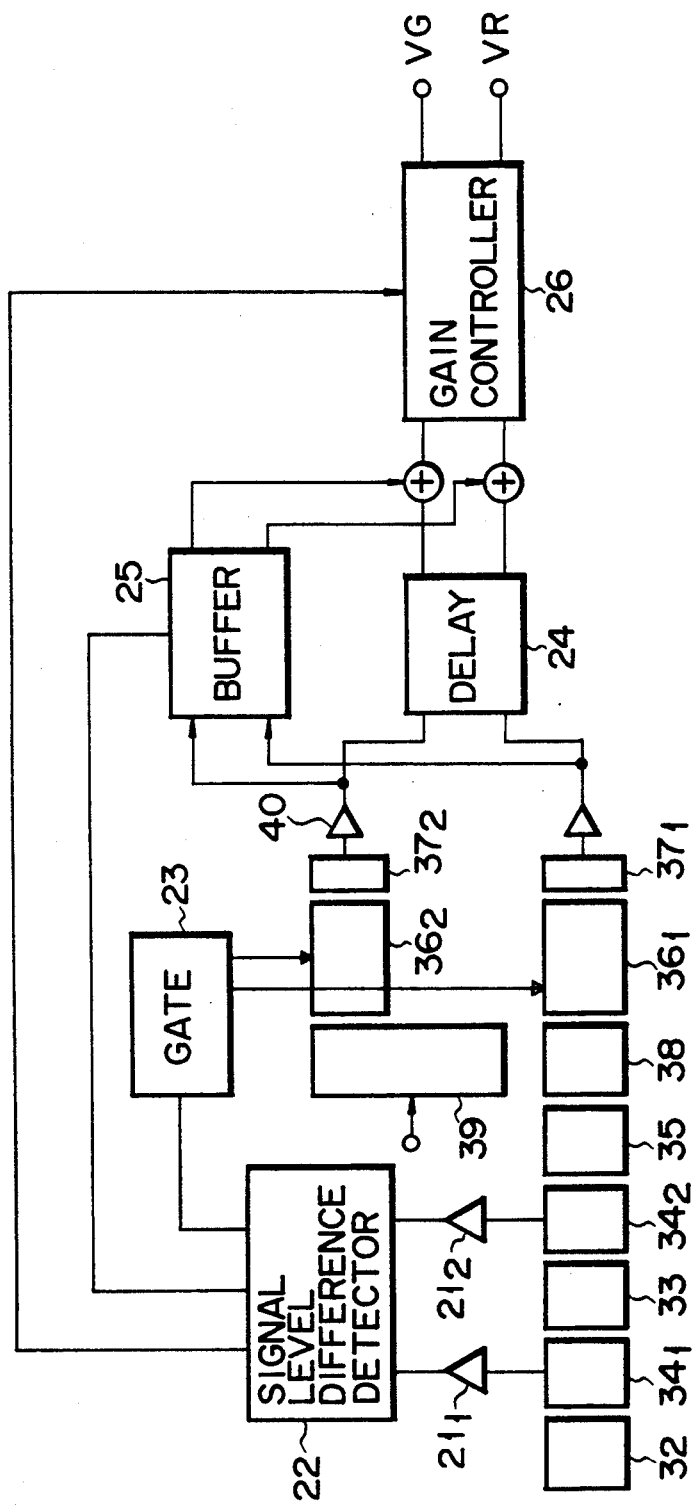
F I G. 5

SOLID STATE IMAGE SENSING DEVICE OUTPUT

BACKGROUND OF THE INVENTION

1. Field of the Invention

The present invention relates to a solid state image sensing device, particularly to a noise-reduced solid state image sensing device.

2. Description of the Related Art

Sensitivity is the most important performance of the solid state image sensing device. Especially for a multiple-pixel element, it is necessary to increase the density of pixels. When the pixel size decreases, the luminous energy coming into one pixel decreases and thereby, the number of signal charges decreases and noises increase.

For a general solid state image sensing device, many pixels for storing signal charges corresponding to image are arranged horizontally and vertically. Many CCD registers are arranged adjacent to the vertical array of pixels. The vertical CCD register transfers signal charges sent from pixels in the vertical direction. The output end of the vertical CCD register adjoins to a horizontal register CCD and vertically-transferred charges are sent to the horizontal register. The horizontal register transfers signal charges sent from the vertical CCD register in the horizontal direction. A signal charge detecting section connected to the horizontal register detects signal charges and outputs them as a image signals.

The charge detecting section used for the conventional solid state image sensing device is the floating diffusion (hereafter referred to as FD) type, in which signal charges are transferred along the channel of a transfer electrode (one transfer stage normally including a plurality of transfer electrodes) and injected into the FD region through an output electrode. The potential of the FD region is modulated by the charge packet injection, detected by an amplifier, and read as an output signal. During the above period, a reset gate is turned off, and the signal charge packet turns on the reset gate before the next signal charge packet is injected before it is eliminated from a reset drain. When the above operation is repeated synchronously with the clock pulse applied to the transfer electrode, an output waveform corresponding to an image can be obtained. The output signal is proportional to the number of signal charges. For the number of signal charges (more accurately, the number of transferred charges; in this description, it is assumed that no dark charge is present), the number of noise equivalent electrons of the signal charge itself is expressed as the square root of Ns. That is S/N comes to the square root of Ns. When Ns decreases, S/N decreases.

The solid state image sensing device includes, for example, a hi-vision for dynamic images and electronic camera for static images. High resolution is required for the solid state image sensing device for hi-vision. The area of a photo-sensing section is normally specified. To improve the resolution in the specified area, pixel area decreases.

When the luminous energy for unit area is the same, the number of signal charges and S/N decrease. For the electronic camera, noises have not the rms value but the peak value. Therefore, the request for improvement of S/N is larger. For example, even if the noise of amplifier A0 is reduced to 0, the noise determined by the number of signal charges is left. There is large request for reproduction of signals with 10 to 100 signal charges at a high S/N for the hi-vision and electronic camera.

Actually, however, S/N is determined by the noise due to the fluctuation inherent in the number of signal charges as previously mentioned. Therefore, this is a big problem.

SUMMARY OF THE INVENTION

It is an object of the present invention to provide a solid state image sensing device capable of eliminating the fluctuation inherent in the number of signal charges.

The present invention provides a solid state image sensing device comprising an image sensing section for outputting optical images as signal charges, a charge transfer section connected to the image sensing section and including a plurality of transfer stages for transferring the signal charges, a first reading section arranged on a plurality of positions of the transfer stages to non-destructively read the transferred signal charges as a plurality of signal outputs, a detecting section for detecting the difference between a plurality of read signal outputs, a signal charge adding section for adding a plurality of signal charges corresponding to a plurality of stages according to a detection signal corresponding to the difference, a second reading section for reading an output signal including at least one addition output signal component corresponding to the added signal charges from the signal charge adding section, a signal inserting section for inserting at least one signal component identical to the addition output signal component into at least one signal position corresponding to at least one signal component canceled from an output signal due to addition of signal charges in accordance with the number of added stages, and a level decreasing section for decreasing the output signal levels of the addition output signal component and the inserted signal component.

The present invention detects the difference between signal outputs of the signal charges non-destructively read by the reading section and adds signal charges according to the difference signal. Thus, a signal increases in proportion to the number of additions, but a noise such as noise in an output section or external circuit is constant regardless of the number of additions. As a result, S/N ratio is improved in proportion to the number of additions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic block diagram of the solid state image sensing device to which the present invention is applied;

FIG. 2 is a schematic block diagram of the signal charge detecting section of the solid state image sensing device according to the first embodiment of the present invention;

FIG. 5 is a schematic block diagram of the signal charge detecting section of the solid state image sensing device according to the second embodiment of the present invention;

DETAILED DESCRIPTION OF THE PREFERRED EMBODIMENTS

Figure 3:
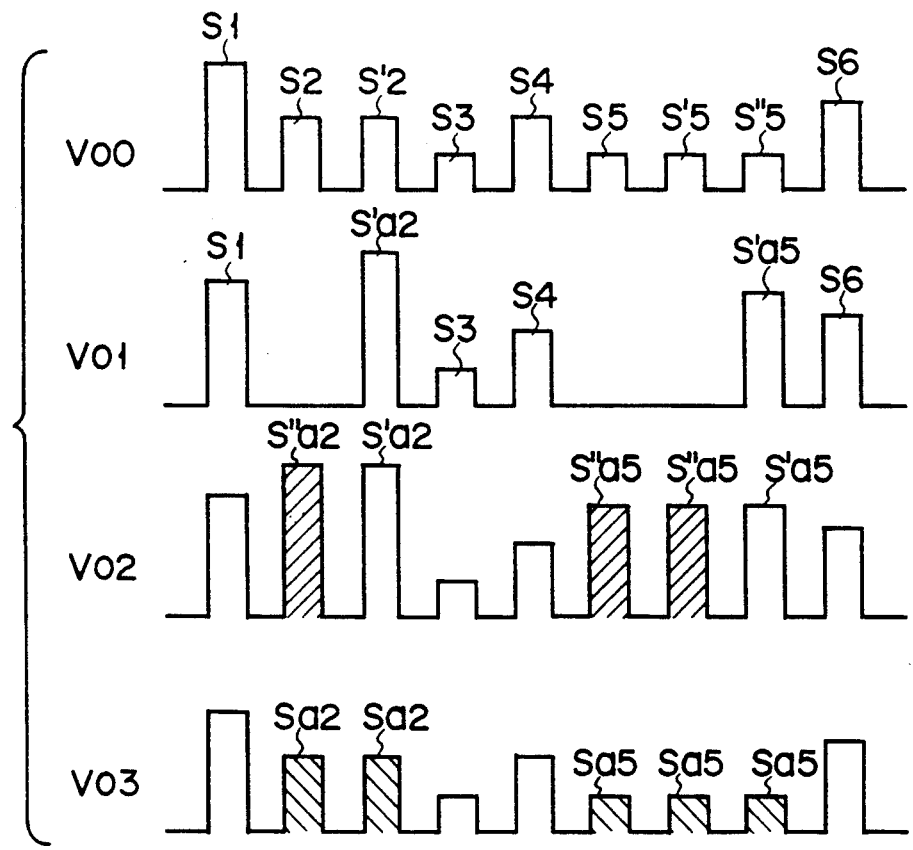
FIG. 3 is a diagram showing the output signal waveform of each portion of the signal charge detecting section according to the first embodiment of the present invention.

The solid state image sensing device is configured as shown in FIG. 1. That is, a number of pixels 1 for storing signal charges corresponding to an image are arranged vertically and horizontally. A plurality of vertical CCD registers 21, 22 . . . , and 2n are arranged adjacent to the vertical array of pixels. These vertical CCD registers transfer the signal charges sent from pixels in the vertical direction by responding to the transfer signals $\phi V1$ through $\phi V4$. The output end of the vertical CCD register adjoins to one horizontal CCD register 3 and vertically-transferred charges are sent to the horizontal register. The horizontal register transfers the signal charges sent from the vertical CCD register in the horizontal direction in synchronism with the transfer signals $\phi H1$ and $\phi H2$. The signal charge detecting section 4 connected to the horizontal register detects signal charges and outputs them as image signals.

For the above solid state image sensing device, transfer electrodes 12, 13, $14_1$, $14_2$, 15 and 16, output electrode 17, and reset gate 18 are formed on a semiconductor substrate 10 as shown in FIG. 2. DC voltage is normally applied to the output electrode 17. The FD (floating diffusion) region 19 is formed between the output electrode 17 and reset gate 18, where signal charges are detected using normal floating diffusion. A reset drain (RD) 20 is formed adjacent to the reset gate 18. The adjacent transfer electrodes $14_1$ and $14_2$ connects with the amplifiers $11_1$ and $11_2$ for non-destructively taking out signal charge packets respectively. The outputs of the amplifiers $11_1$ and $11_2$ are connected to a signal-level-difference detecting circuit 22 for detecting the signal level difference between two consecutive signal charge packets. The first output P1 of the signal-level-difference detecting circuit 22 is connected to a gate circuit 23 and the output terminal of the gate circuit 23 is connected to the transfer electrode 16. The gate circuit 23 controls addition of signal charge packets of a plurality of consecutive stages at the same level. The signal charges added by the transfer electrode 16 are supplied to the FD region 19 through the channel under the output electrode 17. The added signal charges are read out from the FD region as an addition signal component. The output signal Vo1 including the addition signal component is supplied to a delay line 24 and a temporary memory 25. The second output signal P2 of the signal-level-difference detecting circuit 22 is supplied to the temporary memory 25, and the signal stored in the temporary memory 25 and the signal supplied to the delay line 24 are added according to the timing of the second output signal P2. The added signal Vo2 is supplied to a gain control circuit 26 and converted into the specified level by the third output signal P3 of the signal-level-difference detecting circuit 22.

FIG. 3 shows the output signal waveform of each portion of the signal charge detecting section according to the first embodiment of the present invention.

It is assumed that the output of the FD region 19 is V00 when no addition is executed at the channel under the transfer electrode 16. In this case, it is assumed that, for example, there are signal components S1, S2, S'2, S3, S4, S5, S'5, S"5 and S6, and the signal components S2 and S'2 and the signal components S5, S'5 and S"5 have the same output value respectively. The same output value is detected by the signal-level-difference detecting circuit 22 and the gate circuit 23 is controlled by the detected signal. The signal charges of the signal components S2 and S'2 are added and those of the signal components S5, S'5 and S"5 are added at the transfer electrode 16. The output signal is converted into the waveform Vo1 by the above addition, the signal component S2 of the output signal Vo0 is canceled, and the signal component S'a2 at the timing when the signal component S'2 is output becomes double the signal component S2. Similarly, the signal components S5 and S"5 of the output signal Vo0 are canceled and the signal component S'a5 at the timing when the signal component S"5 is output becomes triple the signal component S5. The output signal Vo1 is input to the delay line 24 and the temporary memory 23. The temporary memory 25 has the capacity of one line or one field. The signal component S"a2 is added to the signal obtained by delaying the output signal Vo1 at the timing corresponding to the signal component S2 and the signal component S"a5 is added to it at the timing corresponding to the signal components S5, S'5 and S"5 from the temporary memory 25 at the timing of the signal Vo1 corresponding to the signal components S2, S3 and S'5 of the signal Vo0. Thus, the output signal Vo2 is obtained after one line or one field.

Then, levels of the signal components S"a2 and S'a2 are decreased to ½ and those of the signal components S'a5 and S"a5 are decreased to ⅓ by the gain control circuit 26, and the output signal Vo3 is formed. Thus, the signal components S2, S'2, S5, S'5 and S"5 of the output signal Vo0 are converted into the signal components Sa2 and Sa5.

According to the above signal charge addition method, S/N can be improved as shown below. That is, when it is assumed that dark current is small enough, noises are determined by noise due to the output-section or external-circuit. Noise are kept constant independently of the addition frequency and can adequately be reduced. Therefore, the S/N of the signal components S'a2 and S'a5 is improved proportionally to the number of addition stages. Also, the noise generated due to the processing by the previously-mentioned gain circuit can be decreased to the level which does not matter for the signal level discussed here. Thus, the S/N of reproduced images is improved. Especially when the image of a dark object with small number of signal charges is sensed, the present invention is very effective for improvement of image quality. In other words, when the noise due to fluctuation of the signal charge packet is large enough for the previously-mentioned output-section noise and external-circuit noise and dominates the noise level of reproduced image, the present invention has a large image-quality improvement effect. Because bright and dark portions are mixed in one actual image, improvement of the S/N of the dark portion results in improvement of the image quality of the entire screen.

For this embodiment, the transfer electrode 15 is used to match the timing in which the signal non-destructively output from the channel under the transfer electrodes $14_1$ and $14_2$ is supplied to the transfer electrode 16 through the amplifiers $21_1$ and $21_2$, signal-level-difference detecting circuit 22, and gate circuit 23 with the timing in which the signal charge of the channel under the transfer electrodes $14_1$ and $14_2$ are sequentially transferred and reaches the channel under the transfer electrode 16.

Therefore, a plurality of the transfer electrodes can be used. Moreover, because the signal indicating the number of consecutive signals and their pixel addresses can be obtained from the signal-level-difference detecting circuit 22, it is possible to output the signal from the terminal Vo4 and use it as an image data compression signal.

It is described that two electrodes are used to detect signal level difference. However, three or more transfer electrodes can be used for comparison of signal charge levels.

It is also described that one transfer electrode 16 is used for addition. However, a plurality of electrodes can be used.

FIGS. 4A through 4D show the voltage applied to each electrode of the signal charge detecting section of the present invention and the then potential.

Figure 4A:
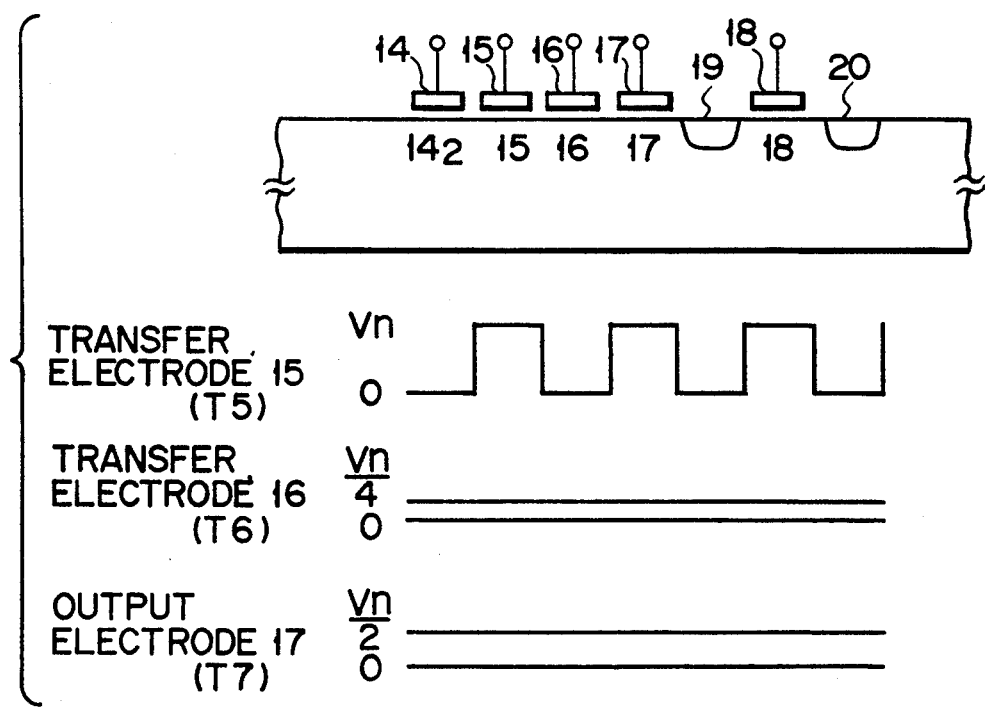
FIGS. 4A to 4D illustrate the voltages applied to each electrode of the signal charge detecting section of the solid state image sensing device according to the second embodiment of the present invention and the then potentials.
Figure 4B:
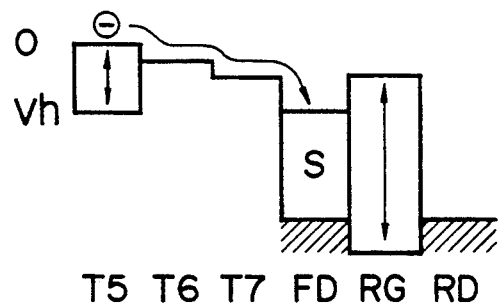

FIG. 4A shows the voltage applied to each electrode when no signal charge is added at the channel under the transfer electrode 16. Rectangular pulses with the potential difference of Vh, for example, are applied to the transfer electrode 15. The DC voltages with the potential differences of Vh/4 and Vh/2, for example, are applied to the transfer electrode 16 and the output electrode 17 respectively. The potential in this case is as shown in FIG. 4B, in which the signal charge stored in the channel under the transfer electrode 15 is transferred to the FD region 19 at the next timing.

Figure 4C:
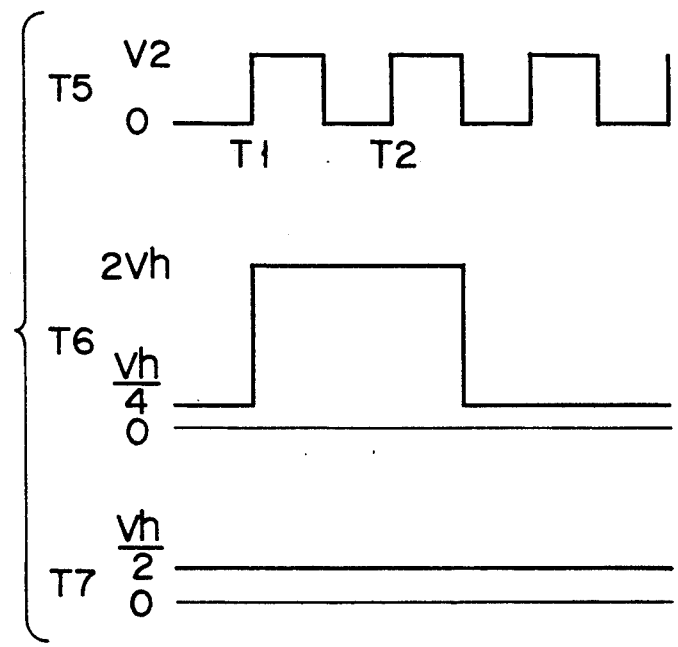
Figure 4D:
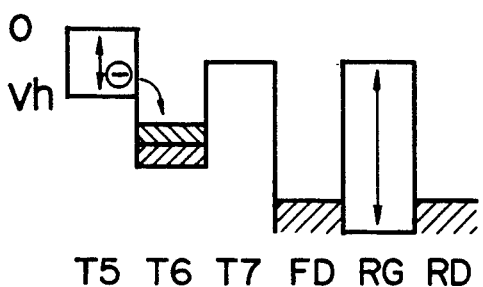

FIG. 4C shows the voltage applied to each electrode when signal charges are added at the channel under the transfer electrode 16. Rectangular pulses with the potential difference of Vh, for example, are applied to the transfer electrode 15. The potential difference of 2Vh is set to the transfer electrode 16 only for the specified period in which the gate circuit 23 is controlled by the output signal of the signal-level-difference detecting circuit 22. In this case, it is assumed that signal charges of two stage with the same level are detected. The DC voltage with the potential difference of Vh/2 is applied to the output electrode 17. The potential in this case is as shown in FIG. 4D. Therefore, signal charges are added by the fact that those stored in the channel under the transfer electrode 15 are stored in the channel under the transfer electrode 16 at the timing of T1 and then stored in the channel under the transfer electrode 16 again.

FIG. 5 is a schematic block diagram of the signal charge detecting section of a semiconductor device using the charge transfer element of the second embodiment of the present invention.

Figure 6:
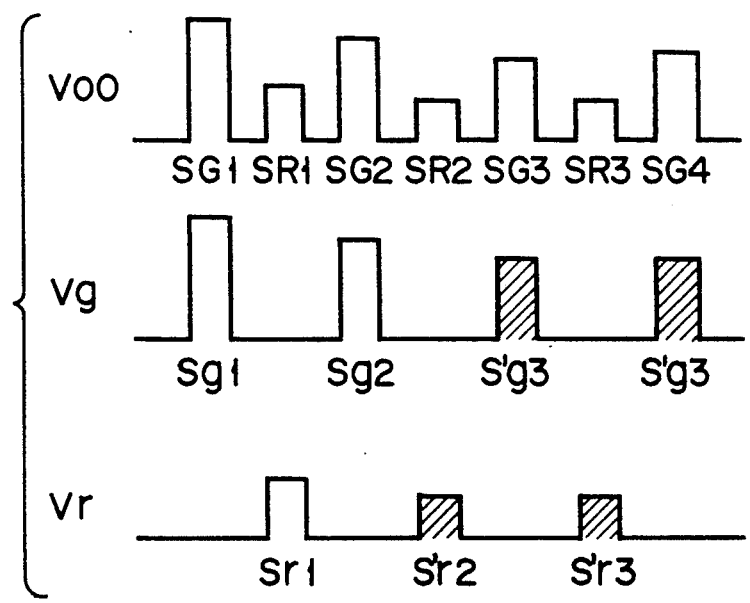
FIG. 6 is a diagram showing the output signal waveform of each portion of the signal charge detecting section of the solid state image sensing device according to the second embodiment of the present invention.

For this embodiment, pixels for a plurality of, e.g. three different colors are arranged in row and column, in a repeating sequence in each row and each column, similarly to a single-plate color CCD, in which there are transfer electrodes 32, $34_1$, 33, $34_2$, 35, 38, $36_1$ and $36_2$, and the output electrodes $37_1$ and $37_2$. The signal charges present in the channels under the electrodes $34_1$ and $34_2$ among the above electrodes are non-destructively taken out through the amplifiers $11_1$ and $11_2$. In this case, the electrodes $34_1$ and $34_2$ are separated from each other at the both sides of the transfer electrode 33. DC voltage is applied to the electrodes $37_1$ and $37_2$. The gate electrode 39 controls the channel under the transfer electrodes 32, $34_1$, 33, $34_2$, 35 and 38 so that the transferred signal charge is transferred to the transfer electrode $36_1$ and $36_2$. It is assumed that the gate electrode 39 is turned off, the signal components Sg1, Sr1, Sg2, Sr2, Sg3 and Sg4 are read from the output amplifier 40 like the output signal Vo0 shown in FIG. 6, and the signal components Sg3 and Sg4 and the signal components Sr2 and Sr3 have the same signal value. It is also assumed that the signal components Sg1, Sg2, Sg3 and Sg4 are green (G) signal, and the signal components Sr1, Sr2 and Sr3 are red (R) signal. The signal components Sr1, Sr2 and Sr3 are output from the amplifier 40 and the signal components Sr1, Sr2 and Sr3 are output from the amplifier 41 by controlling the pulse voltage to be applied to the gate electrode 39. Subsequently, noises are reduced similarly to the procedure in FIG. 2. That is, the signal-level-difference detecting circuit 22 detects signal level difference and the gate circuit 23 controls the addition frequency of signal charge packets at the channel under the transfer electrodes $36_1$ and $36_2$. Insertion of addition signals into the signal train thus obtained is executed by the delay line 24 and the temporary memory 25. Then, the previously-mentioned addition signal is returned to the specified output value by the gain control circuit 26. Thus, the signal components Sg1, Sg2, S'g3 and S'g3 (S'g3 is reduced in noises), and Sr1, S'r2 and S'r2 (S'r2 is reduced in noises) are obtained.

For this embodiment, an example of G and R signals is described. However, for the case of G and B signals, it is also possible to improve SN with the same method.

In addition, for this embodiment, only one transfer electrode 33 is arranged between the transfer electrodes $34_1$ and $34_2$ because the pixel to obtain the same color signal is arranged every one other pixel. However, when the pixel to obtain the same color signal is arranged every two other pixels like RGB signals, two transfer electrodes may be arranged between the transfer electrodes $34_1$ and $34_2$. For this embodiment, the case is described in which the transfer electrodes $36_1$ and $36_2$ used for addition are used one each. However, a plurality of transfer electrodes can be used.

Figure 7:
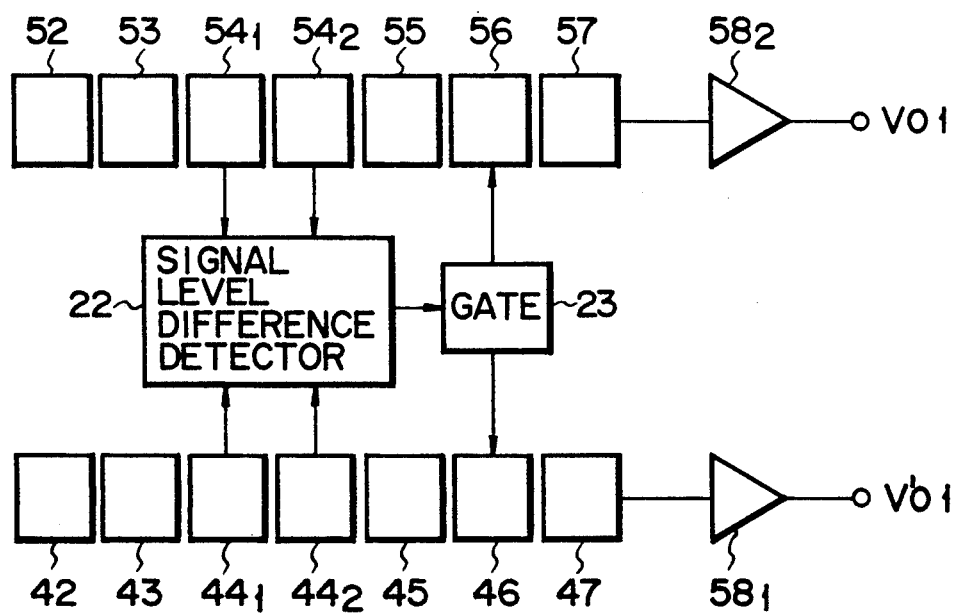
FIG. 7 is a schematic block diagram of the signal detecting section of the solid state image sensing device according to the third embodiment of the present invention.

FIG. 7 is a schematic block diagram of the signal charge detecting section of a semiconductor device using the charge transfer element of the third embodiment of the present invention.

Figure 8:
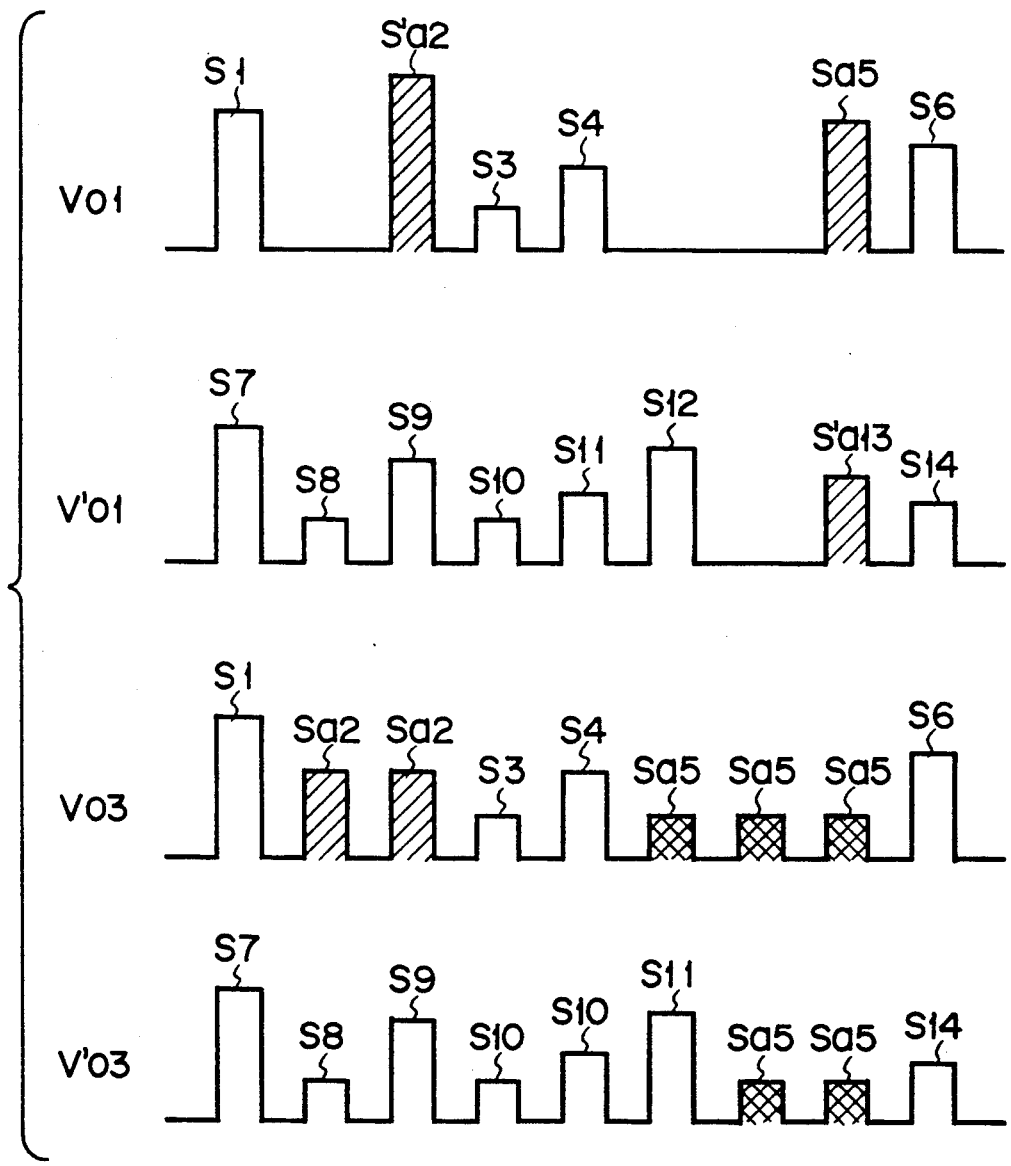
FIG. 8 is a diagram showing the output signal waveform of each portion of the signal charge detecting section of the present invention.

This is an example in which the present invention is applied to a two-wire CCD register. The first horizontal CCD register has the transfer electrodes 42, 43, $44_1$, $44_2$, 45 and 46, and the output electrode 47, and DC voltage is applied to the output electrode 47. The second horizontal CCD register has the transfer electrodes 52, 53, $54_1$, $54_2$, 55 and 56, and the output electrode 57, and DC voltage is applied to the output electrode 37. Each output is read through the amplifiers $58_1$ and $58_2$. The signal-level-difference detecting circuit 22 detects the signal charge level difference under the transfer electrodes $44_1$ and $44_2$ and that between transfer electrodes $54_1$ and $54_2$. The signal-level-difference detecting circuit can also detect the signal charge level difference between the transfer electrodes $44_1$ and $54_2$. When pixel signal charge packets at the same signal charge level are added by the method similar to the method explained in FIG. 2 in the first and second horizontal CCD registers, the output Vo1 (signal components S1, S'a2, S3, S4, S'a5 and S6; in this case, the signal components S'a2 and S'a5 execute addition to the pixels at the second and third stages) is obtained from the first horizontal CCD register, and the output Vo'1 (signal components S7, S8, S9, S10, S11, S12, Sa13 and S14; in this case, the signal component S'a13 execute second-stage pixel addition) is obtained from the second horizontal CCD register as shown in FIG. 8. Then, it is possible to insert noise-reduced pixel signals similarly to the procedure in FIG. 1 and reduce noises by controlling gains. In addition, according to the fact that the pixels at the same signal charge level are two-dimensionally adjacent to each other frequently, signals with many addition pixel stages are selected and inserted when the first and second CCD registers have the same addition signal charge level. Thus, S/N of the entire image is improved. For the output signals Vo1 and Vo'1, the signal components S'a5 and S'a13 have the same one-pixel signal charge level. In this case, the signal component S'a5 with many addition stages is selected and assumed as the signal component Sa5 of the output signals Vo3 and Vo'3 in FIG. 8. In addition, the signal component Sa2 for two-stage pixel addition is reduced in noises by the same processing method as that of the embodiment in FIG. 2 of the present invention.

Figure 9:
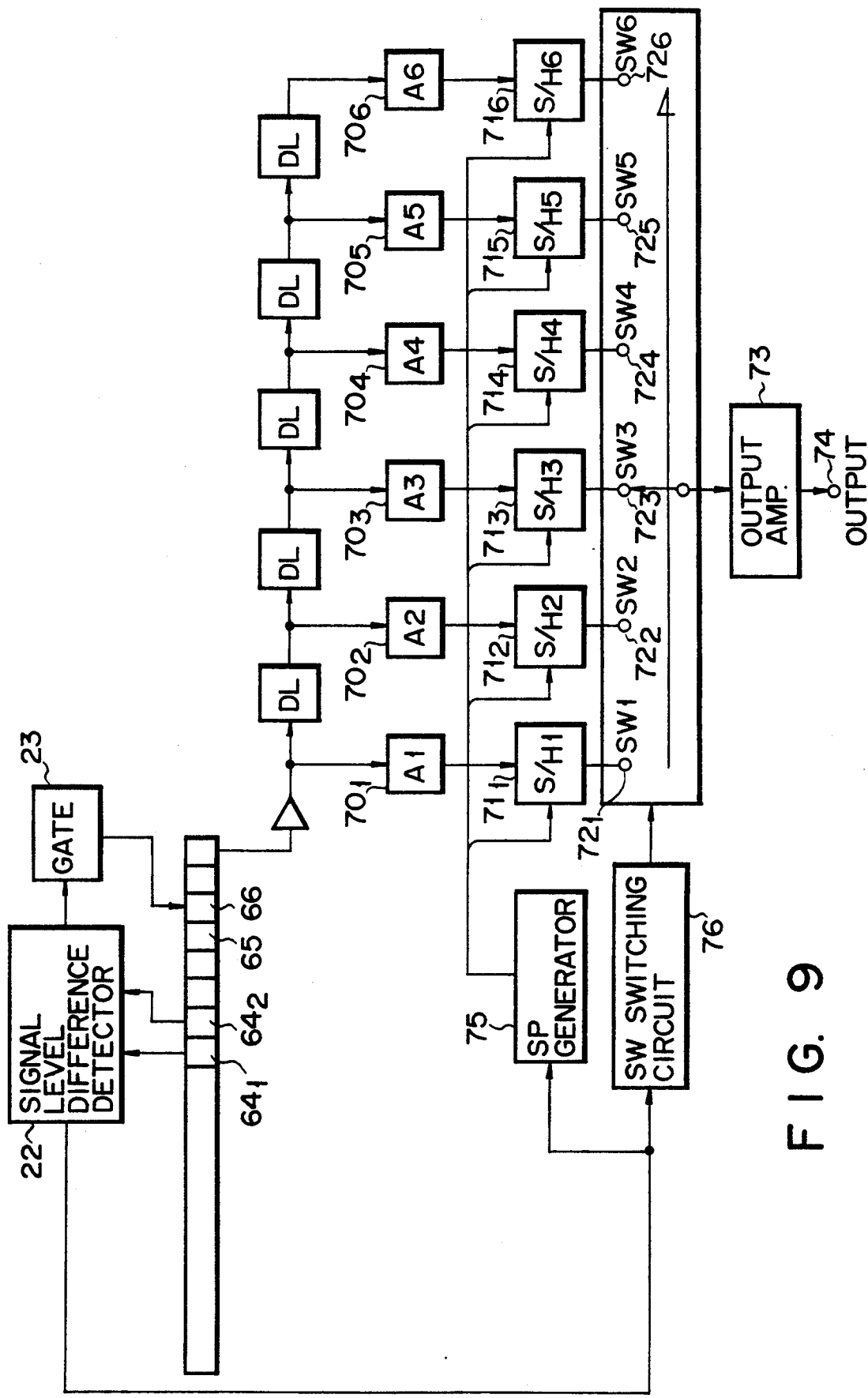
FIG. 9 is a schematic block diagram of the signal charge detecting section of the solid state image sensing device according to the fourth embodiment of the present invention.

FIG. 9 is a schematic block diagram of the signal charge detecting section of a semiconductor device using the charge transfer element of the fourth embodiment of the present invention.

The signal charge level of the channel under the transfer electrodes $64_1$ and $64_2$ of the CCD register is detected by the signal-level-difference detecting circuit 22. When consecutive pixel signals are the same, pixel signal charge packets at a plurality of stages are added in the transfer electrode $64_2$ by the gate control circuit 23. The transfer electrode 65 of at least one stage is present between the transfer electrodes $66_1$ and $64_2$. The CCD output signal is read through the amplifier 69 and supplied to a plurality of delay lines DL which is delayed only during one pixel signal period. The input terminal of the delay line DL at the first stage and the output terminals of a plurality of delay lines DL connected in series are connected to amplifiers $70_1$, $70_2$, $70_3$, $70_4$, $70_5$ and $70_6$ and thus the output signal from the amplifier 69 is read from the output amplifier 73 to the output end 74 through the amplifiers $70_1$, $70_2$, $70_3$, $70_4$, $70_5$ and $70_6$, sample hold circuits $71_1$, $71_2$, $71_3$, $71_4$, $71_5$ and $71_6$ and the switches $72_1$, $72_2$, $72_3$, $72_4$, $72_5$ and $72_6$. There are a sample pulse generation circuit 75 for turning on/off the sample hold circuit and a switch selection circuit 76 for selecting switches. Unless signal charges are added, data is read from the output amplifier 73 and output end 74 through the sample hold circuit $71_6$ and the switch $72_6$ via the amplifier $70_6$ of the gain 1.

Figure 10:
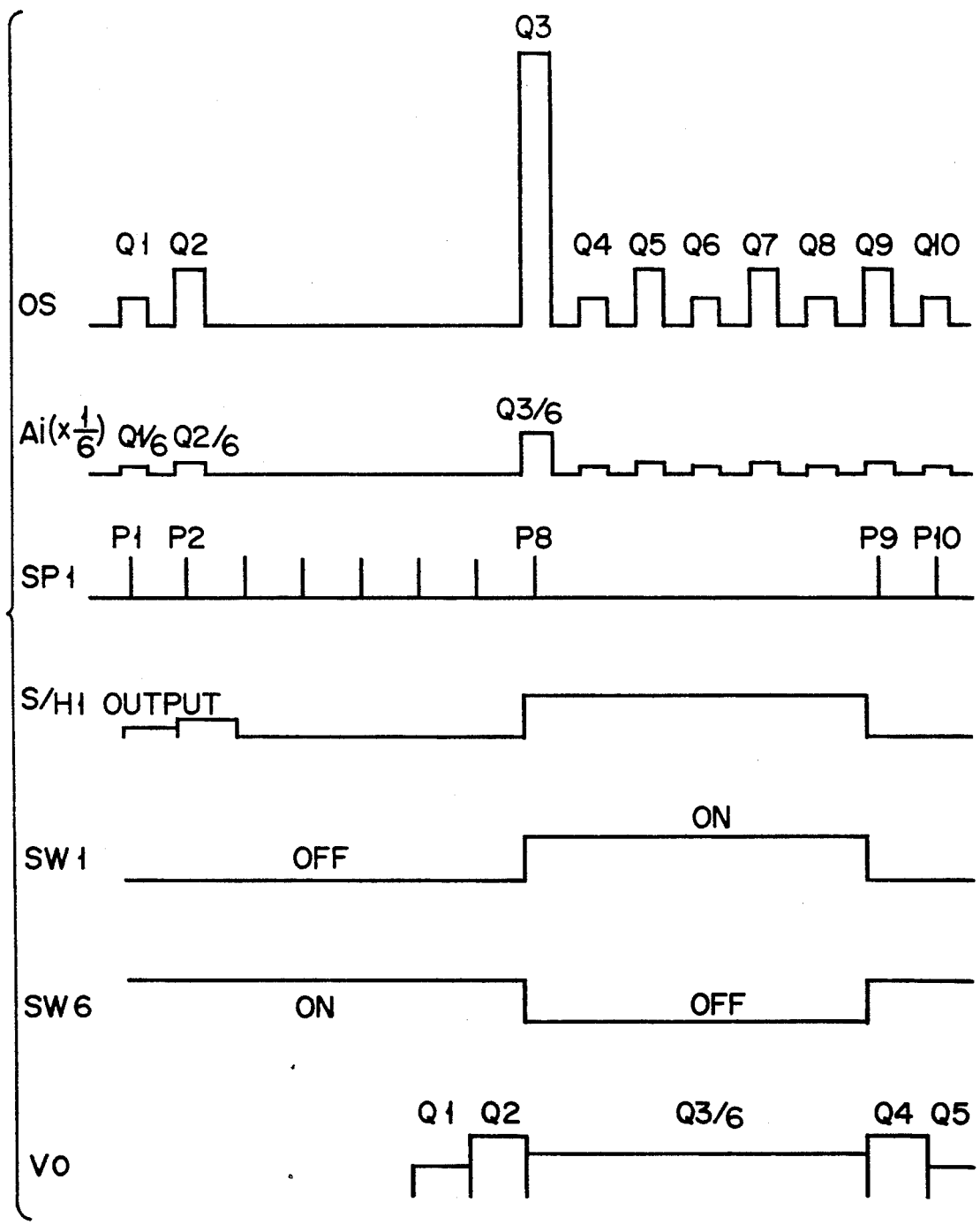
FIG. 10 is a diagram showing the output signal waveform of each portion of the signal charge detecting section of the solid state image sensing device according to the fourth embodiment of the present invention.

FIG. 10 shows the pulse waveform and signal waveform when six consecutive pixels have the same signal charge level in the circuit configuration in FIG. 9. For the output OS of the output amplifier 59, output signal components Q1 through Q10 are obtained through signal charge packet addition similarly to the procedure in FIG. 1. The signal component Q3 is obtained by adding signal charge packets for six consecutive pixels at the same signal charge level. In this case, the amplifier $70_1$ has the gain of 1/6 and the amplifier $70_6$ has the gain of 1. The signal output Ai ($\times 1/6$) after the amplifier $70_1$ has the value 1/6 as small as the output value of the signal component Q3, which is the original output value. However, S/N of the output signal is improved up to six times. The pulse generation circuit 75 generates the pulse signal SP1 having the pulses P1 through P10 for turning on the sample hold circuits S/H1 through S/H6.

In this case, during the period until the signal component Q3, the pulse generation circuit 75 generates the on-pulses P1 through P8, which is turned off during the period of six consecutive pixels and then generates the on-pulses P9 and P10.

Thus, the output signal (S/H1 output) of the sample hold circuit $70_1$ is held for the period of six pixels after the output timing of the signal components Q1, Q2 and Q3. Then, the switch SW1 is turned off and the switch SW6 is turned on during the pixel signal period before generation of the signal component Q3. During the period of six consecutive pixels, the switch SW1 is turned on and the switch SW6 is turned off. Then, the switch SW1 is turned off and the switch SW6 is turned on.

During the above period, the switches SW2 through SW5 are turned off. Thus, the output signal V0 at the output terminal 33 comes to the signal component Q3/6 of six noise-reduced pixels following the signal components Q1 and Q2 and then comes to the signal components Q4 and Q5. Thereby, noise reduction same as that in FIG. 2 can be executed.

In this case, it is assumed that the gains of the amplifiers $70_2$, $70_3$, $70_4$ and $70_5$ are 1/5, ¼, ⅓ and ½ respectively. For two pixels, for example, noise reduction can be executed with the signal output passing through the two-pixel signal period DL by replacing the switch SW5 with the switch SW6. Similarly, noise-reduced images can be obtained by replacing the switch SW6 with the switch SW4 for three consecutive pixels, the switch SW6 with the switch SW3 for four consecutive pixels, and the switch SW6 with the switch SW2 for five consecutive pixels, and also generating the specified pulse from the sample pulse generation circuit. In this case, the signal from the switch SW6 always serves as the reference signal and the signal from any one of the switches SW1 through SW5 is input according to the addition frequency. It is also possible to know the number of consecutive pixels for the signal at the same level by the signal from the signal-level-difference detecting circuit 22.

Though the above embodiment corresponds to addition of up to six pixels, it is possible to change the number of circuit blocks including delay lines (DL), amplifiers (A), sample hold circuits (S/H), and switches (SW) according to the necessary number of addition stages.

Figure 11:
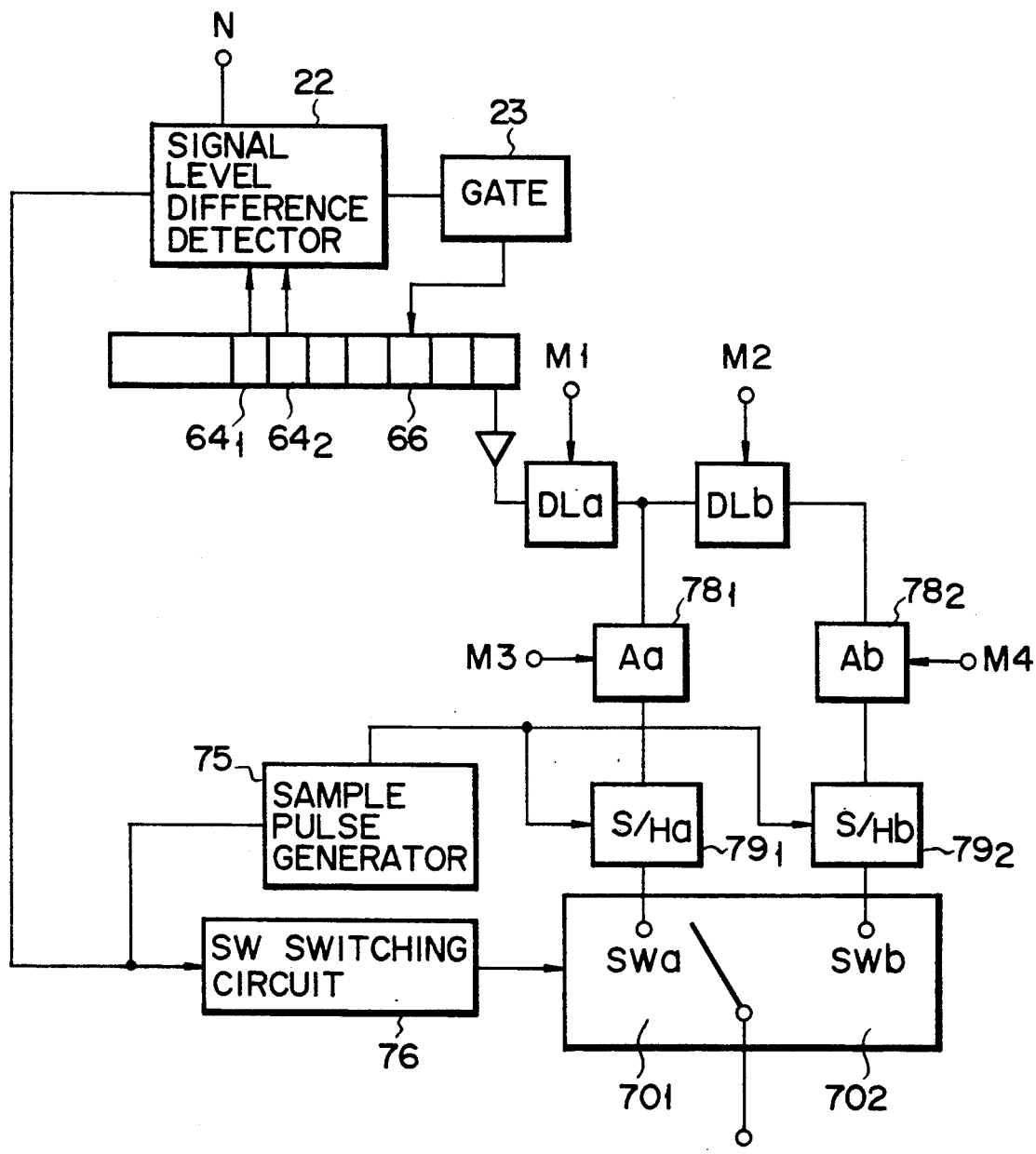
FIG. 11 is a schematic block diagram of the signal charge detecting section of the solid state image sensing device according to the fifth embodiment of the present invention.

FIG. 11 is a schematic block diagram of the signal charge detecting section of a semiconductor device using the charge transfer element of the fifth embodiment of the present invention.

For the embodiment of the present invention in FIG. 9, the number of circuit blocks consisting of delay lines (DL), amplifiers (A), sample hold circuits (S/H) and switches (SW) must be increased as the number of addition pixels increases. However, this embodiment provides the same effect without increasing the number of circuit blocks. The signal charge level of the channel under the transfer electrodes $64_1$ and $64_2$ of the CCD register is detected by the signal-level-difference detecting circuit 12 and pixel signal charge packets of a plurality of stages are added at the transfer electrode 66 by the gate circuit 23 when consecutively pixel signals have the same output. The CCD output is read through the amplifier 59. Up to this step is the same as the embodiment in FIG. 8. Then, the delay-time varying delay lines $77_1$ and $77_2$, and gain-value varying amplifiers $78_1$ and $78_2$ are installed. The amplifiers $78_1$ and $78_2$ are connected with the sample hold circuits $79_1$ and $79_2$ and the switches $80_1$ and $80_2$. The pulse generation circuit 75 and the switch selection circuit 76 are the same as those in FIG. 8. The pixel addition signal is output by the terminal N of the signal-level-difference detecting circuit 22 and input to the delay lines $77_1$ and $77_2$ each of which constant varies and the terminals M1 through M4 of the amplifiers $78_1$ and $78_2$. Thus, noise reduction same as the embodiment in FIG. 8 can be realized because the pixel addition signal is processed by the delay lines whose constant is changed to the specified value and the amplifiers.

Additional advantages and modifications will readily occur to those skilled in the art. Therefore, the invention in its broader aspects is not limited to the specific details, representative devices, and shown and described herein. Accordingly, various modifications may be without departing from the spirit or scope of the general inventive concept as defined by the appended claims and their equivalents.

What is claimed is:

1. A solid state image sensing device comprising:
   image sensing means for outputting optical images as signal charges;
   signal charge transfer means connected to said image sensing means and having of a plurality of transfer stages for transferring said signal charges;
   first reading means arranged on a plurality of positions of said transfer stages to non-destructively read said transferred signal charges as a first output signal including a plurality of first output signal components;
   detecting means for detecting a difference between said first output signal components of said first output signal and outputting a detected signal corresponding to the specified difference of said signal components;
   second reading means for adding said signal charges corresponding to said first output signal components which corresponds to said detected signal and reading a second output signal including a second signal component corresponding to the added signal charge;
   signal inserting means for inserting said second output signal component into at least one of said first output signal components which is canceled due to transfer for addition of said first output signal components and outputting a third output signal including at least one third output signal component corresponding to said second output signal component; and
   means for lowering the signal level of said second and third output signal components according to the number of addition stages.

2. The solid state image sensing device according to claim 1, wherein said first reading means comprises at least two electrodes of the transfer electrodes arranged on said plurality of transfer stages respectively and reading means for reading said signal charges through the two electrodes and outputting said plurality of first output signal components to said detecting means.

3. The solid state image sensing device according to claim 2, wherein said detecting means comprises signal-level-difference detecting means connected to said first reading means to detect a difference between signal levels of said first output signal components corresponding to said two electrodes and output the detected signal.

4. The solid state image sensing device according to claim 3, wherein said detecting means outputs said detected signal when said signal levels are equal.

5. The solid state image sensing device according to claim 1, wherein said second reading means comprises means for adding said signal charges in response to said detected signal and a floating diffusion region for reading the added signal charge.

6. The solid state image sensing device according to claim 1, wherein said signal inserting means comprises a memory for temporarily storing said second output signal read by said second reading means, delaying means for delaying said second output signal for the specified time, and means for adding the second output signal component output from said delaying means to said second output signal read from said memory in response to said detected signal.

7. The solid state image sensing device according to claim 6, wherein said delaying means comprises a variable delay line capable of changing the delay according to the number of addition stages.

8. The solid state image sensing device according to claim 1, wherein said transfer means comprises at least first and second horizontal CCDs and said signal inserting means comprises means for inserting the output signal component of one of said first and second horizontal CCDs which has more addition stages than the other into the output signal components of said first and second horizontal CCDs.

9. The solid state image sensing device according to claim 1, which includes means for using the signal detected by said detecting means for a signal band compression signal.

10. The solid state image sensing device according to claim 1, wherein said detecting means outputs the detected signal when said output signal components have the same level.

11. The solid state image sensing device according to claim 1, which includes two transfer electrodes formed at the both sides of at least one-stage transfer electrode and a signal level difference detector for detecting a signal level difference between said first output signal components output to these transfer electrodes.

12. The solid state image sensing device according to claim 1, wherein said second reading means includes first and second transfer electrodes for reading the transferred signal charge in response to said detected signal and a gate electrode for selectively switching said signal charge to either of said first and second transfer electrodes.

13. The solid state image sensing device according to claim 1, wherein said signal inserting means comprises delay elements of a plurality of stages for successively delaying said second output signal only for one pixel signal period, a plurality of amplifiers respectively connected to the outputs of said delay elements, sample hold circuit means for sample-holding the outputs of said amplifiers, and means for controlling sample hold of said sample hold circuit means.

14. The solid state image sensing device according to claim 1, wherein said signal inserting means comprises variable delaying means for varying delay time according to said detected signal and delaying said second output signal according to variable delay time, and amplifier means connected to an output of said variable delay means for varying a gain.

15. A solid state image sensing device comprising:

image sensing means for outputting optical images as signal charges;

signal charge transfer means including a plurality of transfer stages for transferring said signal charge output from said image sensing means;

first reading means arranged on said transfer stages and non-destructively reading said transferred signal charge as a first output signal;

detecting means for detecting a difference between adjacent signal components of said first output signal and outputting a detected signal when said signal components are equal in level;

second reading means for adding the signal charge corresponding to said signal components at equal level to form an added signal component and reading the second output signal including the added signal component;

signal inserting means for outputting a third output signal including consecutive signal components at the same level as that of the added signal component formed by inserting said added signal component into at least one of said output signal components resulting in idle levels due to transfer for addition; and means for lowering the signal level of a plurality of consecutive signal components at the level equal to that of said added signal component according to the number of addition stages.

* * * * *